United States Patent
Guo et al.

(10) Patent No.: US 6,374,512 B1
(45) Date of Patent: Apr. 23, 2002

(54) METHOD FOR REDUCING CONTAMINATION OF A SUBSTRATE IN A SUBSTRATE PROCESSING SYSTEM

(75) Inventors: Xin Sheng Guo, Mountain View; Shin-Hung Li, Sunnyvale; Lawrence Lei, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/631,051

(22) Filed: Aug. 1, 2000

Related U.S. Application Data

(62) Division of application No. 09/120,005, filed on Jul. 21, 1998, now Pat. No. 6,096,135.

(51) Int. Cl.[7] ................................................. F26B 3/08
(52) U.S. Cl. .............................. 34/362; 34/363; 34/381; 34/442
(58) Field of Search .......................... 34/359, 360, 362, 34/363, 381, 417, 442; 118/708, 712, 715, 725; 414/217, 904

(56) References Cited

U.S. PATENT DOCUMENTS

| | | | |
|---|---|---|---|
| 5,213,650 A | | 5/1993 | Wang et al. ............... 156/345 |
| 5,292,554 A | * | 3/1994 | Sinha et al. ............... 427/251 |
| 5,328,722 A | * | 7/1994 | Ghanayem et al. ......... 427/250 |
| 5,370,709 A | * | 12/1994 | Kobayashi ............. 118/728 X |
| 5,516,367 A | * | 5/1996 | Lei et al. ................. 118/725 |
| 5,574,247 A | * | 11/1996 | Nishitani et al. ........... 118/798 |
| 5,578,532 A | * | 11/1996 | Van De Ven et al. ....... 437/245 |
| 5,583,736 A | * | 12/1996 | Anderson et al. ........... 361/234 |
| 5,620,525 A | * | 4/1997 | Van De Ven et al. ....... 118/728 |
| 5,697,427 A | * | 12/1997 | Ngan et al. ................ 165/80.1 |
| 5,766,365 A | * | 6/1998 | Umotoy et al. ............. 118/728 |
| 5,769,951 A | * | 6/1998 | Van De Ven et al. ....... 118/725 |
| 5,810,931 A | * | 9/1998 | Stevens et al. ............. 118/721 |
| 5,843,233 A | * | 12/1998 | Van De Ven et al. ....... 118/715 |
| 5,855,687 A | * | 1/1999 | Dubois et al. .............. 118/729 |
| 5,882,417 A | * | 3/1999 | Van De Ven et al. ....... 118/728 |
| 5,886,864 A | * | 3/1999 | Dvorsky ..................... 361/234 |
| 5,888,304 A | * | 3/1999 | Umotoy et al. ............. 118/720 |
| 5,950,328 A | * | 9/1999 | Ichiko et al. ................ 34/381 |
| 5,960,555 A | * | 10/1999 | Deaton et al. ................. 34/58 |
| 6,035,549 A | * | 3/2000 | Chevalier et al. .......... 34/61 X |
| 6,073,366 A | * | 6/2000 | Aswad ......................... 34/367 |

FOREIGN PATENT DOCUMENTS

| | | | |
|---|---|---|---|
| EP | 0 467 623 A2 | 1/1992 | ............ C23C/16/54 |
| EP | 0 553 691 A1 | 8/1993 | ............ C23C/16/44 |
| JP | 165070 | * 6/2000 | ............ H05K/7/14 |

* cited by examiner

*Primary Examiner*—Stephen Gravini
(74) *Attorney, Agent, or Firm*—Moser, Patterson & Sheridan, LLP

(57) ABSTRACT

Method and apparatus for reducing contamination of a substrate in a substrate processing system. The apparatus has a substrate support, a gas directing shield circumscribing the substrate support and a shadow ring disposed vertically above the substrate support and gas directing shield for retaining the substrate. The gas directing shield and substrate support define an annular channel that is provided with an edge purge gas. The edge purge gas imparts a force at the edge of a substrate resting on the substrate support the lifts it off the substrate supports and against the shadow ring. The shadow ring further has a plurality of conduits extending from its upper surface to its sidewall to provide a path for the edge purge gas to vent and to impede the flow of process gases under the backside and around the edge of the substrate. The method includes the steps of providing a substrate upon the substrate support, applying a first flow of gas to a first set of ports to lift the substrate off of the substrate support, centering the substrate upon the substrate support and applying a second flow of gas to a second set of ports to establish and maintain thermal control of the substrate.

8 Claims, 5 Drawing Sheets

METHOD FOR REDUCING CONTAMINATION OF A SUBSTRATE IN A SUBSTRATE PROCESSING SYSTEM

This application is a divisional of U.S. patent application Ser. No. 09/120,005, filed Jul. 21, 1998, now U.S. Pat. No. 6,096,135 which is hereby incorporated by reference in its entirety.

BACKGROUND OF THE DISCLOSURE

1. Field of the Invention

The invention is related to field of semiconductor wafer fabrication systems and more specifically, to an apparatus and method for reducing particulate contaminants from adhering to or diffusing into a semiconductor substrate being processed on the apparatus.

2. Description of the Background Art

In the field of integrated circuit fabrication and manufacturing, chemical vapor deposition (CVD) is a well established technique for depositing thin films on semiconductor substrates (i.e. a silicon wafer). Typically, the wafer is introduced to a process chamber and the wafer is heated to a desired temperature to initiate the deposition process. Specifically, the wafer placed upon a pedestal heater. The pedestal heater contains one or more electrodes connected to a power source. When the power source is activated, a current is passed through the electrodes thereby heating the pedestal and subsequently the wafer.

A combination of inert carrier and reactant gases are introduced to the chamber. The elevated wafer temperature causes the reactive gases to break down on the wafer surface thereby depositing the desired film on the wafer surface. For example, the chemical vapor deposition of copper is achieved by using a precursor (reactant) known as Cupraselect, which has the formula Cu(hfac)L. The L represents a liquid base compound containing trimethylvinylsilane (TMVS). The (hfac) represents hexafluoroacetylacetonato, and Cu represents copper. During the CVD of copper, the precursor is vaporized and flowed with a carrier gas such as Argon into a deposition chamber containing a wafer. In the chamber, the precursor is infused with thermal energy at the wafer's surface, and the following reaction results:

$$2Cu(hfac)L \rightarrow Cu+Cu(hfac)_2+2L \qquad \text{(Eqn. 1)}$$

The resulting copper (Cu) deposits on the upper surface of the wafer, along with the Cu(hfac)$_2$ byproduct. The gaseous Lewis base byproduct (2L) is purged from the chamber. To maintain the desired chemical reaction, the desired temperature in the chamber and at the wafer surface must be maintained. Accordingly, the wafer is usually in direct contact at all time with the pedestal heater.

With the wafer in contact with the pedestal heater at all times, wafer processing can be negatively affected. For example at high temperature, the pedestal heater, usually aluminum, has a high coefficient of friction relative to the backside of the silicon wafer. Should the wafer shift on the pedestal heater, for example during transfer into and out of the chamber, the backside of the wafer would be scratched. At the elevated temperatures under which chemical vapor deposition occurs, scratching releases aluminum from the pedestal heater surface which then diffuses into the silicon of the wafer. Accordingly, unexpected contaminant particles are introduced into the silicon wafer. For example, conductive particles can short the semiconductor devices, i.e. gate structures that are created on the wafer surface. Likewise, non-conducting particles can increase the resistivity of conductive layers thereby degrading performance of the device.

Other conditions can also affect wafer processing. The inert and reactive gases can also leak into the lower regions of a process chamber during the fabrication process. If this condition occurs, deposition particles may undesirably form on the pedestal heater or on the backside of the wafer. As such, the wafer is further contaminated as well as the chamber components. Once contaminated, the wafer can transfer the contaminant particles to other chambers and/or a clean wafer entering the CVD chamber can become contaminated by the improperly coated chamber components. Additionally, if a wafer is not centered on the pedestal heater properly, the edge exclusion zone about the periphery of the wafer will vary. The edge exclusion zone is defined as the edge of the wafer which is not subjected to the semiconductor wafer fabrication process. The variations in the edge exclusion zone will ultimately lead to lower yield of the wafer.

Therefore, there is a need in the art for an apparatus and method of thin film deposition via CVD that can repeatably center (axially align) wafers on the pedestal heater prior to the deposition process as well as prevent backside scratching of the wafer and resultant diffusion of contaminant particles.

SUMMARY OF THE INVENTION

The disadvantages associated with the prior art are overcome with the present invention of a method and apparatus for reducing contamination of a substrate in a substrate processing system. The apparatus has a substrate support, a gas directing shield circumscribing the substrate support and a shadow ring disposed vertically above the substrate support and gas directing shield for retaining the substrate. The substrate support has two sets of ports for providing edge purge and backside purge gases. The gas directing shield and substrate support define an annular channel that is coincident with one set of ports to provide the edge purge gas. The edge purge gas imparts a force at the edge of a substrate resting on the substrate support that lifts the substrate off the substrate support and against the shadow ring. The shadow ring has an upper surface having an inner lip that extends radially inward and a plurality of centering tabs disposed below this inner lip. The centering tabs keep the substrate axially aligned with the substrate support and shadow ring. The shadow ring further has a plurality of conduits extending from its upper surface to its sidewall to provide a path for the edge purge gas to vent and to impede the flow of process gases under the backside and around the edge of the substrate.

In accordance with the present invention a method for reducing contamination of a substrate in a substrate processing system is also disclosed. The method includes the steps of providing a substrate upon the substrate support, applying a first flow of gas to a first set of ports to lift the substrate off the substrate support, centering the substrate upon the substrate support, and applying a second flow of gas to a second set of ports to establish and maintain thermal control of the substrate. The first flow of gas flows an edge purge gas through the annular channel defined by a gas directing shield circumscribed by a substrate support to force the substrate against a plurality of centering tabs disposed below an inner lip of a shadow ring. The second flow of gas flows a thermal transfer gas to a second set of ports in the substrate support for transferring thermal energy between the substrate support and a backside of the substrate. With the apparatus and method of the present invention, substrates such as semiconductor wafers can be processed without needlessly scratching the backside of the wafer or introducing such a surface to process contaminants. The annular channel gas flow lifts the wafer off the substrate support thereby reducing the likelihood of scratching due to the different rates of thermal expansion of the wafer and substrate support. Additionally, the annular channel gas flow is directed in such a manner as to control the edge exclusion zone on the wafer and reduce undesirable deposition on chamber components. The second flow of gas directly under the wafer not only impedes the flow of a reactant gas along the backside of the substrate to thereby reduce the amount of contaminants that can contact and deposit upon the backside of the wafer, but also provides the important thermal transfer medium to heat the backside of the wafer to an adequate process temperature.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
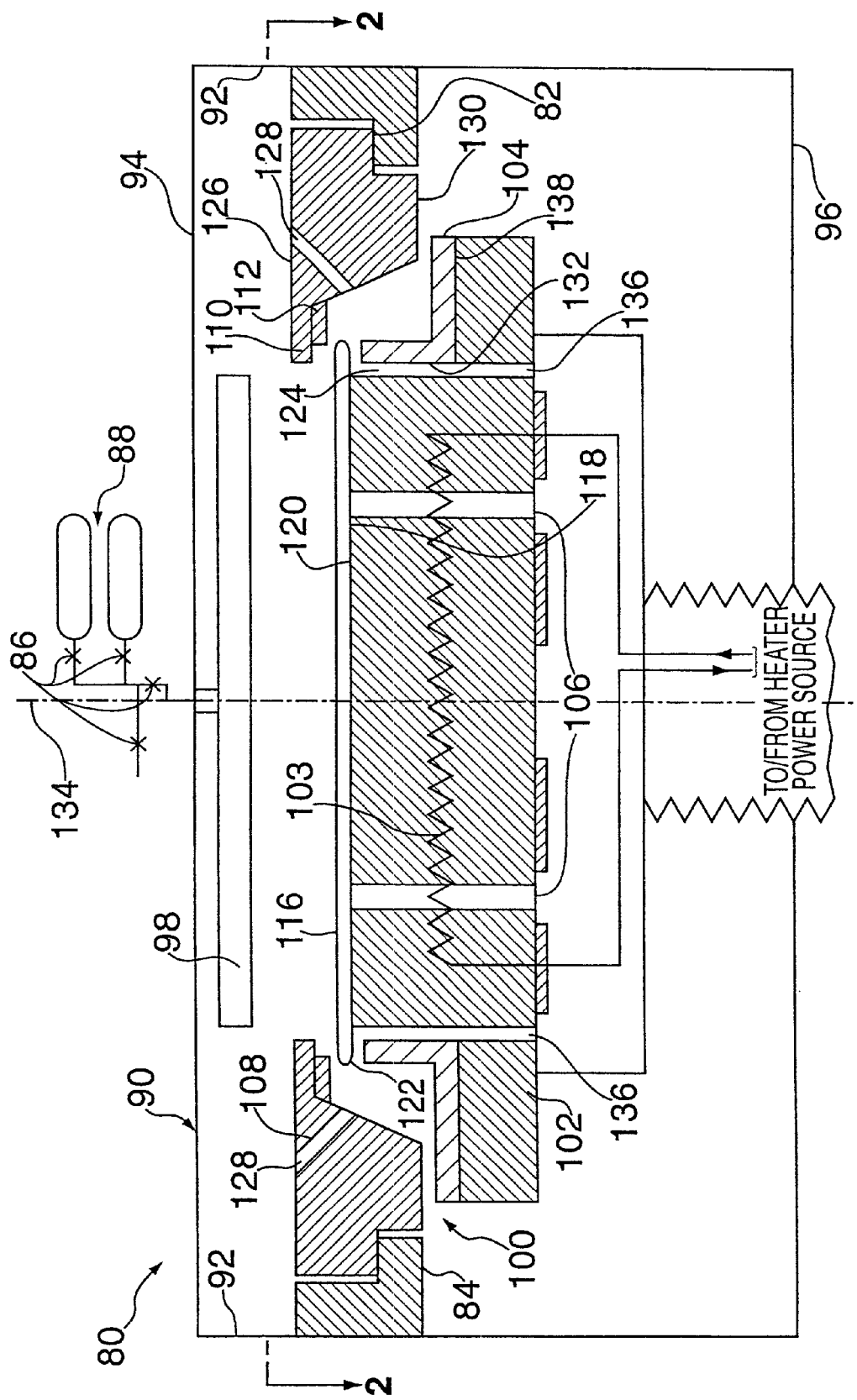
FIG. 1 depicts a cross-sectional view of a substrate process system containing the present invention.

FIG. 1 depicts a cross sectional view of the apparatus of the subject invention. Specifically, the apparatus 100 is a novel substrate support 102 and shadow ring 108 contained with a CVD deposition system 80. One particular CVD deposition system than can incorporate the subject invention is the Endura® cluster tool manufactured and sold by Applied Materials, Inc. of Santa Clara, Calif. Typically, in such a system 80, a process chamber 90 is defined by sidewalls 92, top 94 and floor 96. The chamber 90 contains a distribution plate or showerhead 98 attached to the top 94. The showerhead 98 is connected to one or more liquid or gas sources 88 via a plurality of valves 86. The sources 88 provide the required levels of a carrier and reactants to the showerhead 98 for dispersion into the chamber 90. The system 80 may also include a computer activated distribution panel (not shown) between the sources 88 and the showerhead 98 to assist in the mixing and distribution of the carrier and reactants to the showerhead 98. Additionally, an annular plate 84 circumscribes the chamber walls 92 and provides a ledge 82 upon which the shadow ring 108 rests.

A substrate support 102 supports a substrate (i.e., a silicon wafer) 116 within a CVD chamber 90. The substrate support 102 is fabricated from a durable metallic material such as aluminum or a ceramic such as aluminum nitride. The substrate support 102 comprises a first set of ports 136 and a second set of ports 106 which are described in greater detail below. The substrate support 102 also functions as a heater and contains additional components to heat the wafer 116. For example, the substrate support 102 can be provided with one or more resistive heater coils 103 which are connected to a power source (not shown). The power source provides a current flow through the coil 103 which generates heat within the substrate support 102 which is then conducted to the wafer 116. Specifically, a surface of the pedestal 118 contacts a backside of the wafer 120 to obtain appropriate thermal conduction.

A gas directing shield 104 circumscribes the substrate support 102 and defines a narrow annular channel 124 between the gas shield 104 and the substrate support 102. The annular channel 124 is coincident with the first set of ports 136 in the substrate support. The gas shield 104 is depicted as a cylindrical body with a smooth inner face 132 and is preferably welded to a flange 138 of the substrate support 102. The shadow ring 108 circumscribes the substrate support 102 and gas shield 104. The shadow ring 108 prevents process (carrier and reactant) gases from flowing and undesirably depositing on portions of the chamber 90 below the shadow ring 108.

An edge 122 of the wafer 116 overhangs the substrate support 102. An inner lip 110 of an upper surface 126 of the shadow ring 108 extends radially inward to overhang the edge 122 of the wafer 116. Additionally, a plurality of centering tabs 112 are disposed below the inner lip 110 of shadow ring 108. In a preferred embodiment of the invention, twelve centering tabs are equilaterally spaced about the shadow ring 108. The shadow ring 108 is also provided with a plurality of conduits 128 which extend from the upper surface 126 through the shadow ring 108 to a lower surface 130.

Figure 2:
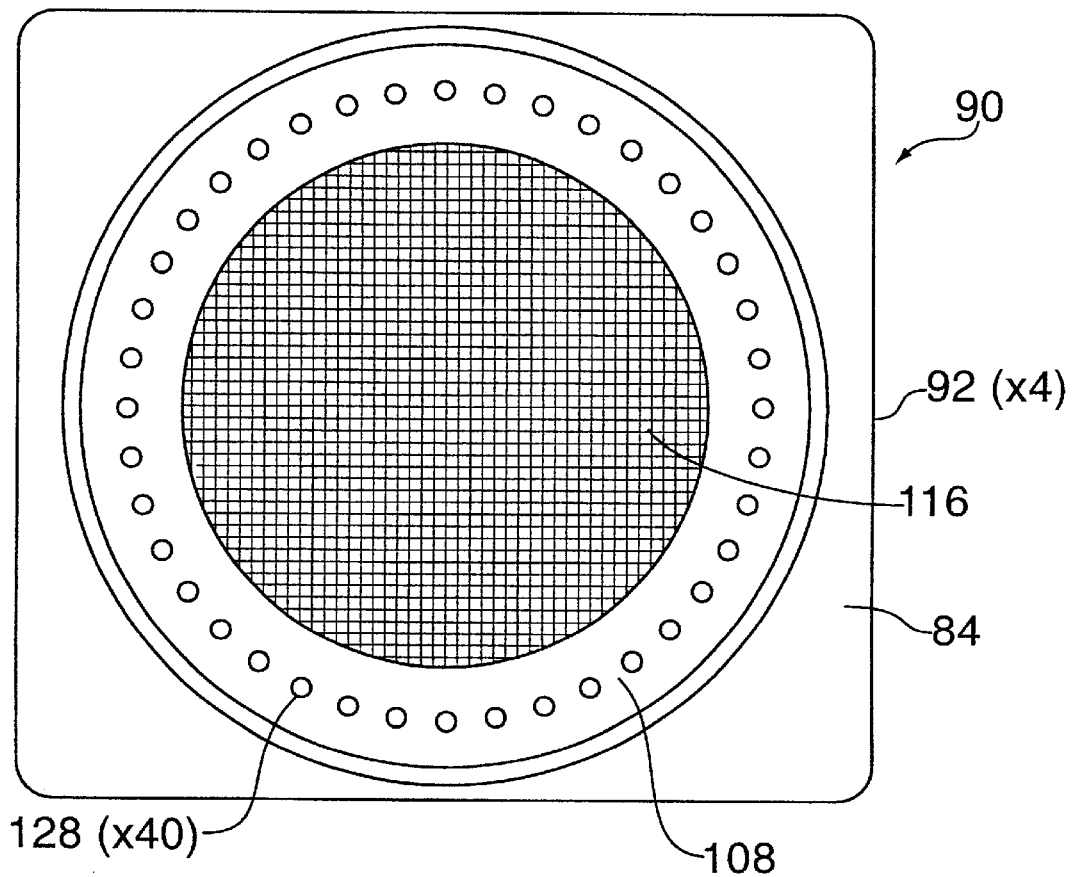
FIG. 2 depicts a top view of the process system looking along lines 2—2 of FIG. 1.

FIG. 2 shows a top view of the apparatus 100 as seen along lines 2—2 of FIG. 1. Specifically, the shadow ring 108 circumscribes and is disposed above wafer 116. In a preferred embodiment of the invention, forty (40) ports 128 are provided in the shadow ring 108 to vent gases from portions of the chamber 90 below the shadow ring 108 as explained in greater detail below.

Figure 3:
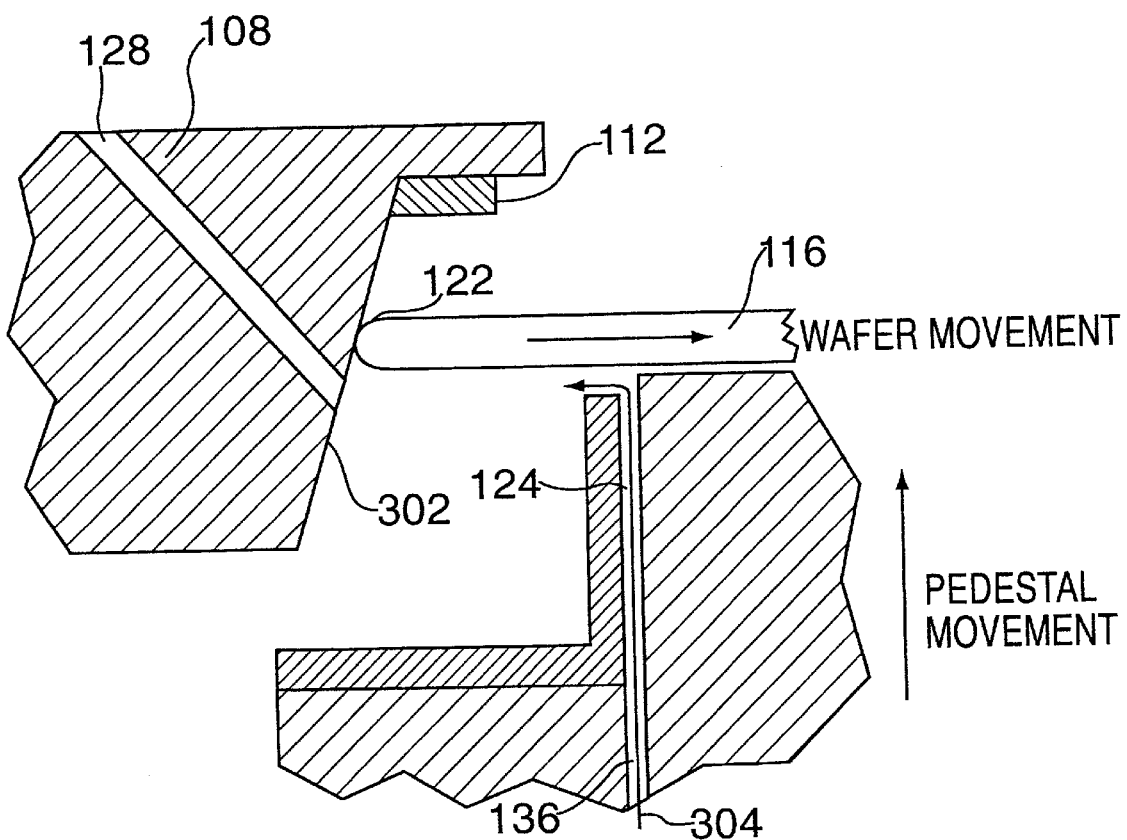
FIG. 3 depicts an intermediate stage of substrate positioning and centering in accordance with the present invention.

FIG. 3 depicts an intermediate stage of wafer positioning in accordance with present invention. In operation, a wafer 116 is introduced into the chamber 90 and is placed upon the substrate support 102. The substrate support 102 is raised up towards the shadow ring 108. A flow of edge purge gas 304 is provided in the first set of ports 136 to the channel 124. The flow of edge purge gas 304 forces the wafer 116 off the pedestal surface 118. If the wafer 116 is off center, the edge 122 will come in contact with a sidewall 302 on the shadow ring 108. The substrate support 102 and shadow ring 108 are aligned about a central axis 134 (see FIG. 1) which corresponds to the center of the chamber 90 and these components do not move in a horizontal direction. Therefore, as the substrate support 102 continues to move vertically upwards toward the shadow ring 108, the wafer 116, floating slightly above the substrate support 102, will be pushed into an axial alignment with the substrate support and shadow ring, 102 and 108 respectively. In other words, as the wafer 116 is continually pushed upwards via the substrate support 102 and edge purge flow 304, it is also pushed horizontally via contact with the sidewall 302 of the shadow ring 108. The wafer 116 is finally centered when it contacts the centering tabs 112 which retain the wafer in axial alignment with the substrate support 102 and shadow ring 108.

Figure 4:
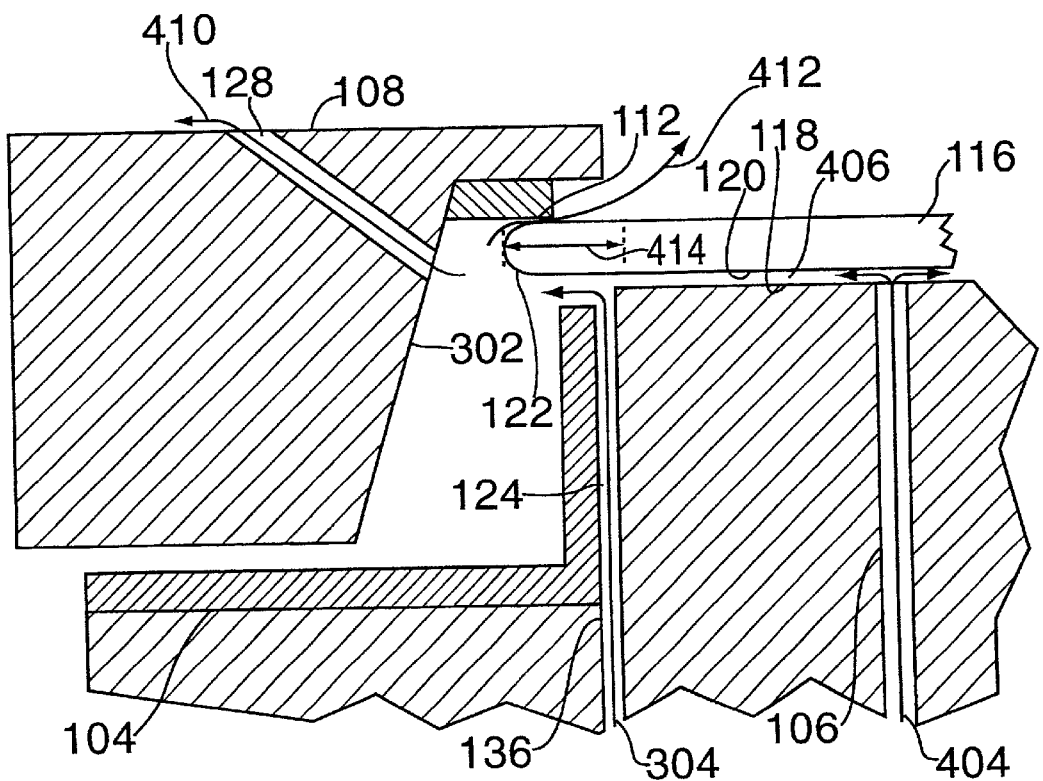
FIG. 4 depicts an operational stage of substrate positioning in accordance with the present invention.

FIG. 4 depicts an operational stage of wafer positioning in accordance with the present invention. Specifically, once the wafer 116 is axially aligned with the substrate support 102 and shadow ring 108 it is vertically retained in position. The flow of edge purge gas 304 then splits into two paths. The first path 410 is through the conduit 128 and radially outward along the upper surface 126 of the shadow ring 108. The second path 412 is around the edge 122 of the wafer 116, between the centering tabs 112 and above the wafer 116. With the edge purge gas flows 304, 410 and 412, CVD reaction is prevented or reduced at key locations including the upper surface 126 of the shadow ring 108 and an edge exclusion zone 414 of the wafer 116. Specifically, the edge exclusion zone 414 is defined as an area on the wafer surface that is not processed and varies with the edge purge gas flow 414. That is, when a small flow 414 is present, more reactants reach the wafer to react and thereby deposit on the surface; hence, the edge exclusion zone is small. As the flow 414 is increased, the amount of edge purge gas colliding with neighboring reactants increases creating a "flow curtain" effect; hence, less deposition occurs along the edge and the edge exclusion zone increases. The edge purge gas is selected from the group consisting of an inert gas, such as Argon; Hydrogen and nitrogen and in a preferred embodiment is Argon. Eventually, these gases are removed from the chamber by a pressure control device mounted to the chamber 90 (i.e., a turbo pump, cryo pump or the like, not shown).

A second flow of gas 404 is provided in ports 106 to assist in backside purge and heat transfer between the substrate support 102 and the wafer 116 and vertical retention against shadow ring 108. Specifically, backside purge gas flow 404 also forces the wafer 116 off the pedestal surface 118 and against the centering tabs 112. A gap 406 is thereby created and filled by the backside purge gas flow 404 which carries heat from the substrate support 102 to the wafer backside 120. Heat transfer occurs mostly due to convection via the gas flow 404 than by conduction. Similar to the edge purge flow 304, the backside purge flow 404 follows either or both of the paths 410 and 412 and eventually exhausted from the chamber in the manner described above.

The backside purge gas flow 404 and gap 406 between the substrate support 102 and the wafer 116 reduces the likelihood of scratching of the backside of the wafer 120 and resultant diffusion of conductive metals (i.e., aluminum from the substrate support or copper from erroneously directed deposition). Backside purge gas is selected from the group consisting of an inert gas, such as Argon; Hydrogen and nitrogen and, in a preferred embodiment, is a mixture of hydrogen and nitrogen. As such, the likelihood of deposition on the backside of the wafer 120 is further reduced as reactant gases do not readily flow within the gap 406.

Since the wafer 116 is no longer in contact with the substrate support 102 a drop in temperature is realized at the wafer 116. However, the backside purge gas flow 404 transfers an adequate amount of heat to the backside of the wafer 120 so that deposition temperatures are still maintained at the wafer 116. For example the substrate support 102 will be maintained at approximately 205–210° C. during a normal CVD process. The wafer 116 under these conditions will be maintained at approximately 196° C.

Figure 5:
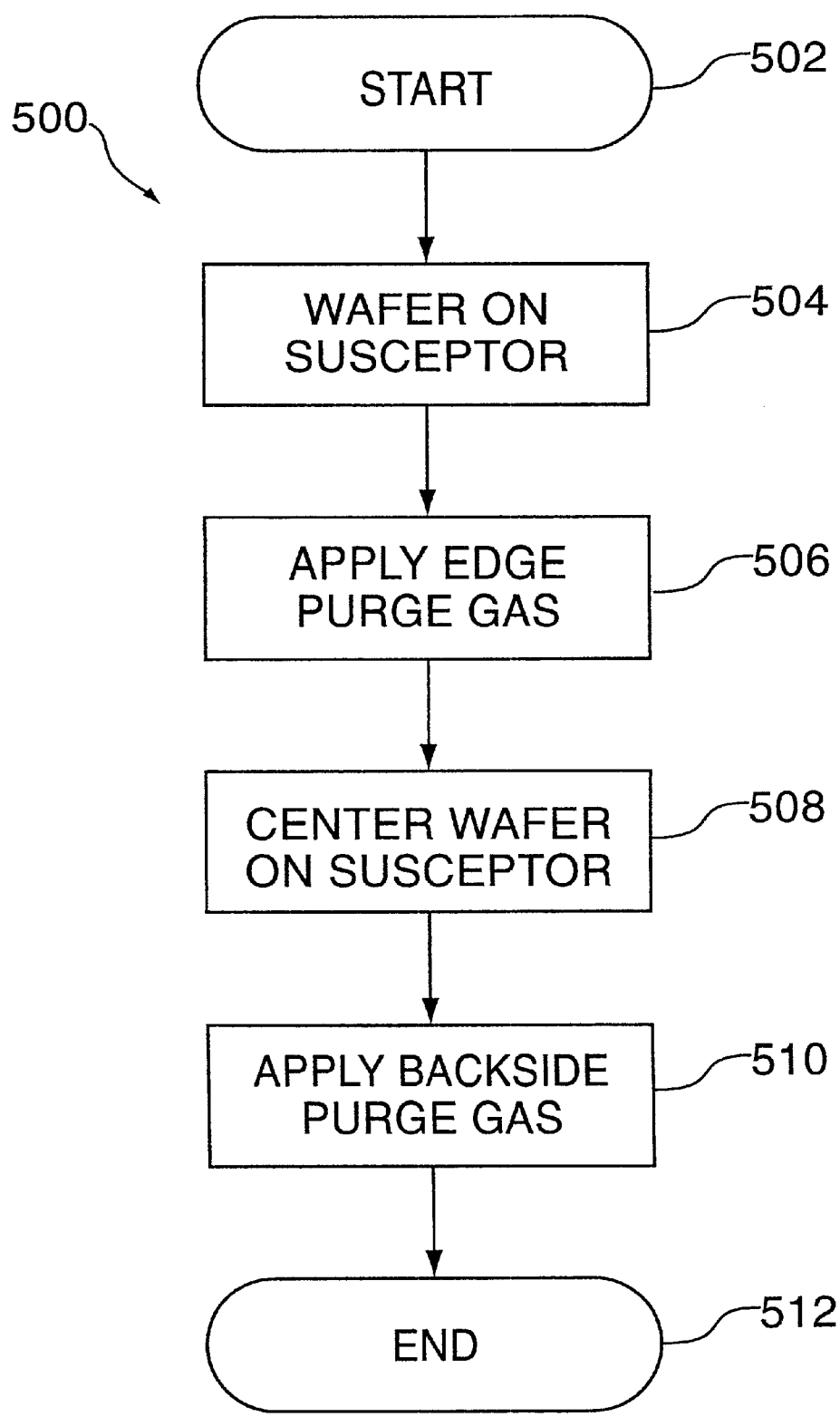
FIG. 5 depicts a method for reducing particulate contaminants in accordance with the present invention.

A novel method of reducing particulate contaminants on a semiconductor wafer is also disclosed in the present invention. FIG. 5 depicts a flowchart of the inventive method 500 and starts at step 502. At step 504, a wafer is disposed upon a susceptor such as a substrate support or the like in a CVD process chamber. The susceptor has at least two sets of ports for providing gas from a remote gas source to the surface of the susceptor. The first set of ports is coincident with an annular channel created by a gas shield circumscribing the susceptor. This channel provides edge purge gas to the edge of the wafer to lift it off the susceptor and purge the edge of the wafer and other chamber components of reactants. The second set of ports are defined as at least one backside purge gas transfer port within the support substrate which provides gas to the backside of the wafer to purge the wafer backside of particles and reactants and to transfer thermal energy between the susceptor and the wafer.

At step 506, a first flow of gas (i.e., an edge purge gas) is provided to the first set of ports and annular channel to vertically lift the wafer off the surface of the susceptor.

At step 508, a centering step is carried out whereby the susceptor and wafer floating thereabove are lifted upwards towards a shadow ring. The shadow ring and susceptor are axially aligned. If the wafer is not axially aligned with the shadow ring and susceptor, it is automatically aligned by the vertical movement of the susceptor. Specifically, the misaligned wafer is contacted by a sidewall of the shadow ring and horizontally shifted into axial alignment with the shadow ring and susceptor. The force of the edge purge gas retains the wafer against a plurality of centering tabs disposed below an inner lip of the shadow ring. As such, horizontal and rotational movement of the wafer is prevented and axial alignment is maintained. The edge purge gas flow establishes two paths past the edge of the wafer. A first path is through a plurality of ports provided in the shadow ring to decrease the likelihood of reactants reacting undesirably on the backside of the wafer and upper surface of the shadow ring. The second path is between the centering tabs and above the wafer to control the size of the edge exclusion zone as described above. The lifting gas may be any of the following: Argon, Hydrogen and nitrogen and is preferably Argon.

At step 510, a second flow of gas (i.e., a backside purge gas) is provided to the second set of ports. The second flow of gas transfers thermal energy (heat) via convection from the susceptor to the backside of the wafer to establish and maintain wafer temperatures suitable for CVD reactions to occur (i.e., approximately 200–600° C. The second flow of gas also greatly reduces the likelihood of particles comprising or adhered to the susceptor from diffusing into the backside of the wafer. That is, the wafer will not be scratched due to the grinding action of thermal expansion between the wafer and susceptor. Steps 508 and 510 may occur in the order stated above, in reverse order or simultaneously. The thermal transfer may be any of the following: Argon, Hydrogen and nitrogen and is preferably Argon. The method ends at step 512.

Accordingly, a new method and apparatus for processing of semiconductor wafers via CVD is disclosed. The apparatus is capable of axially aligning (centering) a substrate such as a semiconductor wafer on a susceptor. Further, by strategic placement of ports in the susceptor and shadow ring above the susceptor, gas flow beneath the substrate can be controlled and exploited to improve process conditions. A channel defined by the susceptor and neighboring gas shield provides gas to the edge of the substrate to orient and vertically retain it for processing. A set of ports within the susceptor provide gas to the backside of the substrate to assist in temperature regulation of the substrate via convection. These ports also prevent undesirable process gases from depositing particles on the backside of the wafer. As such, particulate contaminants caused by scratch-induced diffusion of susceptor material, undesirable deposition and the like are greatly reduced.

Although various embodiments which incorporate the teachings of the present invention have been shown and described in detail herein, those skilled in the art can readily devise many other varied embodiments that still incorporate these teachings.

What is claimed is:

1. Method for reducing contamination of a substrate in a substrate processing system, the system comprising a chamber, a substrate support having first and second sets of ports within the chamber, a gas directing shield circumscribing and defining an annular channel with the substrate support and a shadow ring disposed vertically above the substrate support and gas directing shield for retaining the substrate, the method comprising the steps of:

(a) providing a substrate upon the substrate support;
   (b) applying a first flow of gas to lift the substrate off the substrate support;
   (c) centering the substrate upon the substrate support; and
   (d) applying a second flow of gas to maintain thermal control of the substrate.

2. The method of claim 1 wherein the step of centering the substrate upon the substrate support further comprises raising the substrate support into close proximity to the shadow ring whereby an unoriented substrate is contacted and horizontally shifted by a sidewall of the shadow ring and axially aligned with the substrate support and shadow ring.

3. The method of claim 1 wherein the first flow of gas is an edge gas flowing through the first set of ports and the annular channel to establish two paths past an edge of the substrate.

4. The method of claim 3 wherein the first path is through a plurality of ports provided in the shadow ring to reduce deposition on an upper surface of the shadow ring.

5. The method of claim 3 wherein the second path is between the shadow ring and substrate to control the size of an edge exclusion zone on the substrate.

6. The method of claim 1 wherein said second flow of gas is a backside purge gas through said second set of ports in the substrate support for transferring thermal energy between the substrate support and a backside of the substrate and reducing contaminants from contacting the backside of the substrate.

7. The method of claim 1 wherein the gas from the first flow of gas is selected from the group consisting of Argon, hydrogen and nitrogen.

8. The method of claim 1 wherein the gas from the second flow of gas is selected from the group consisting of Argon, hydrogen and nitrogen.

* * * * *

UNITED STATES PATENT AND TRADEMARK OFFICE
CERTIFICATE OF CORRECTION

PATENT NO. : 6,374,512 B1  Page 1 of 1
DATED : April 23, 2002
INVENTOR(S) : Xin Sheng Guo et al.

It is certified that error appears in the above-identified patent and that said Letters Patent is hereby corrected as shown below:

Column 2,
Line 66, please make a new paragraph starting at "With the apparatus".

Column 8,
Line 2, please change "an edge gas" to -- an edge purge gas --.

Signed and Sealed this

Twenty-ninth Day of October, 2002

Attest:

Attesting Officer

JAMES E. ROGAN
*Director of the United States Patent and Trademark Office*